United States Patent
Chen et al.

(10) Patent No.: US 9,407,474 B2
(45) Date of Patent: Aug. 2, 2016

(54) PHASE DETECTING DEVICE AND CLOCK DATA RECOVERY CIRCUIT EMBEDDED WITH DECISION FEEDBACK EQUALIZER

(71) Applicant: National Chiao Tung University, Hsinchu (TW)

(72) Inventors: Wei-Zen Chen, Hsinchu (TW); Yu-Ping Huang, Hsinchu (TW); Yau-Chia Liu, Hsinchu (TW); Zheng-Hao Hong, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/855,802

(22) Filed: Sep. 16, 2015

(65) Prior Publication Data

US 2016/0080178 A1    Mar. 17, 2016

(30) Foreign Application Priority Data

Sep. 17, 2014    (TW) .............................. 103132039 A

(51) Int. Cl.
*H03H 7/30* (2006.01)
*H04L 25/03* (2006.01)
*H04L 7/00* (2006.01)

(52) U.S. Cl.
CPC ........ *H04L 25/03057* (2013.01); *H04L 7/0016* (2013.01); *H04L 7/0079* (2013.01)

(58) Field of Classification Search
CPC ............... H04L 25/03057; H04L 2025/0349; H04L 2025/03617; H04L 2025/03503; H04L 25/03038; H04L 2025/03477; H04L 25/03885; H04L 25/031; H03H 21/0012
USPC ......... 375/233, 232, 231, 230, 229, 295, 316, 375/219
See application file for complete search history.

(56) References Cited

U.S. PATENT DOCUMENTS

2004/0146131 A1* 7/2004 Wilson ................. H03D 13/003
375/375
2013/0223566 A1* 8/2013 Linn .................... H04L 27/3818
375/298

* cited by examiner

*Primary Examiner* — Zewdu Kassa
(74) *Attorney, Agent, or Firm* — Mintz Levin Cohn Ferris Glovsky and Popeo, P.C.; Peter F. Corless; Steven M. Jensen

(57) ABSTRACT

A phase detecting device and a clock data recovery circuit are provided. The phase detecting device includes a decision feedback equalizer having first and second sample-hold sub-circuits, an edge detector having a third sample-hold sub-circuit, a first XOR gate, and a second XOR gate. The first sample-hold sub-circuit, the second sample-hold sub-circuit and the third sample-hold sub-circuit obtain first sample data, second sample data and transition data, respectively. The first XOR gate executes an XOR operation for the first sample data and the transition data to generate first clock phase shift information. The second XOR gate executes the XOR operation for the second sample data and the transition data to generate second clock phase shift information. Therefore, high-frequency noise disturbance generated from conventional clock data recovery circuit and decision feedback equalizer can be avoided.

12 Claims, 7 Drawing Sheets

PHASE DETECTING DEVICE AND CLOCK DATA RECOVERY CIRCUIT EMBEDDED WITH DECISION FEEDBACK EQUALIZER

CROSS-REFERENCES TO RELATED APPLICATIONS

This application claims under 35 U.S.C. §119(a) the benefit of Taiwanese Application No. 103132039, filed Sep. 17, 2014 the entire contents of which are incorporated herein by reference.

TECHNICAL FIELD

This present invention relates to phase detecting devices and clock data recovery circuits, and, more specifically, to a phase detecting device and a clock data recovery circuit embedded with a decision feedback equalizer.

BACKGROUND

In a receiver, the equalizer (EQ) and the clock data recovery circuit (CDR) are essential blocks in order to demodulate the attenuation digital signal to the correct information.

The equalizer commonly is the discrete equalizer (DEQ) by using a linear equalizer (LEQ) plus a level of post-cursor. One of the most widely used discrete equalizers is the decision feedback equalizer (DFE).

The clock data recovery circuit can be implemented by many means, which can be roughly classified as analog clock data recovery circuits and digital clock data recovery circuits. The analog clock data recovery circuit can integrate the clock phase error information to provide a control voltage of the voltage controlled oscillator to calibrate the phase. The digital clock data recovery circuit transfers the clock phase error information into phase shift digital code by logical circuits, and then calibrates the phase by the phase interpolator (PI).

However, the bottleneck of the current technology is the arrangement order of the equalizer and the clock data recovery circuit. If the clock data recovery circuit is arranged ahead the discrete equalizer, the equalization effect of the linear equalizer needs to be large enough to allow the clock data recovery circuit to operate properly. The drawbacks are that the noise will be enlarged simultaneously and the power consumption will be increased. Nevertheless, if the clock data recovery circuit is arranged behind the discrete equalizer, the edge value of signal will be determined by the sampling clock of the equalizer. Therefore, it is necessary to use the signal before the equalizer incorporating more logical operation to calibrate it, so that the complexity and area of the circuit are highly increased.

Therefore, the best mean is to combine the clock data recovery circuit and the discrete equalizer, so as to conduct equalization and calibration simultaneously. However, all of the current innovations of combining the clock data recovery circuit and the discrete equalizer use the discrete equalizer and Hogge phase detecting device, but this phase detecting device is only applicable to the analog clock data recovery circuit.

FIG. 1A depicts the circuit diagram of Alexander phase detecting device 1 of the prior art. FIG. 1B depicts a timing chart of the phase detecting device 1 in FIG. 1A of the prior art. The phase detecting device 1 comprises three D-type flip-flops (Da, Db, and Dc), a first XOR gate (Xor1), and a second XOR gate (Xor2).

The D-type flip-flop (Da) obtains the first sample data (D1) of the input data signal (DataIn) in light of the positive clock signal (Clki) and generates the first serial data, for example, the odd serial data (Odd). The D-type flip-flop (Db) obtains the second sample data (D2) of the input data signal (DataIn) in light of the negative clock signal ($\overline{Clki}$) and generates the second serial data, for example, the even serial data (Even). The D-type flip-flop (Dc) obtains the transition data (T1) of the input data signal (DataIn) in light of the edge clock signal (Clkq) and generates the transition data (Edge).

The first XOR gate (Xor1) executes an XOR operation for the first sample data (D1) of the first serial data (Odd) and the transition data (T1) of the transition data (Edge) to obtain the first clock phase shift information (UP). The second XOR gate (Xor2) executes the XOR operation for the second serial data (Even) and the transition data (T1) of the transition data (Edge) to obtain the second clock phase shift information (DN). The first clock phase shift information (UP) and the second clock phase shift information (DN) are utilized to adjust the phases of these clock signals (Clki), ($\overline{Clki}$), and (Clkq), so as to make them simultaneously lead forward or lag backward.

However, the aforementioned phase detecting device 1 can obtain the first clock phase shift information (UP) and the second clock phase shift information (DN) only, but does not have the function of feedback equalization. Therefore, the phase detecting device 1 is not able to conduct equalization and calibration for the input data signal (DataIn) simultaneously.

Consequently, how to overcome the above problems of the prior art, in fact, has become anxious to resolve the issue.

SUMMARY

The present invention provides a phase detecting device, comprising: a decision feedback equalizer including a first feedback equalization circuit having a first sample-hold sub-circuit and a second feedback equalization circuit having a second sample-hold sub-circuit, wherein the first sample-hold sub-circuit obtains first sample data of an input data signal in light of a positive clock signal, and the second sample-hold sub-circuit obtains second sample data of the input data signal in light of a negative clock signal corresponding to the positive clock signal; an edge detector electrically connected to the first feedback equalization circuit or the second feedback equalization circuit and having a third sample-hold sub-circuit that obtains transition data of the input data signal in light of an edge clock signal corresponding to the positive clock signal; a first XOR gate electrically connected to the first feedback equalization circuit and the edge detector and executing an XOR operation for the first sample data and the transition data to generate first clock phase shift information; and a second XOR gate electrically connected to the second feedback equalization circuit and the edge detector and executing the XOR operation for the second sample data and the transition data to generate a second clock phase shift information.

The present invention also provides a clock data recovery circuit, comprising: a phase detecting device including: a decision feedback equalizer including a first feedback equalization circuit having a first sample-hold sub-circuit and a second feedback equalization circuit having a second sample-hold sub-circuit, wherein the first sample-hold sub-circuit obtains first sample data of an input data signal in light of a positive clock signal, and the second sample-hold sub-circuit obtains second sample data of the input data signal in light of a negative clock signal corresponding to the positive clock signal; an edge detector electrically connected to the first feedback equalization circuit and the second feedback equalization circuit and having a third sample-hold sub-circuit that obtains transition data of the input data signal in light of an edge clock signal corresponding to the positive clock signal; a first XOR gate electrically connected to the first feedback equalization circuit and the edge detector and executing an XOR operation for the first sample data and the transition data to generate a first clock phase shift information; and a second XOR gate electrically connected to the second feedback equalization circuit and the edge detector and executing the XOR operation for the second sample data and the transition data to generate a second clock phase shift information; and a clock adjustment circuit electrically connected to the phase detecting device and adjusting phases of the positive clock signal, the negative clock signal and the edge clock signal based on the first clock phase shift information and the second clock phase shift information.

In an embodiment, the first feedback equalization circuit includes a first adder, a first latch and a second latch electrically connected to the first sample-hold sub-circuit sequentially, a first multiplier electrically connected to the second feedback equalization circuit, and a second multiplier electrically connected to the first adder and the second latch, and obtains a plurality of the first sample data of the input data signal, and the first adder, the first latch, the second latch, the first multiplier and the second multiplier conduct feedback equalization to the first sample data to generate first serial data.

In an embodiment, the second feedback equalization circuit includes a second adder, a third latch and a fourth latch electrically connected to the second sample-hold sub-circuit sequentially, a third multiplier electrically connected to the first feedback equalization circuit, and a fourth multiplier electrically connected to the second adder and the fourth latch, and obtains a plurality of the second sample data of the input data signal, and the second adder, the third latch, the fourth latch, the third multiplier and the fourth multiplier conduct feedback equalization to the second sample data to generate second serial data.

In an embodiment, the edge detector includes a fifth latch and a sixth latch electrically connected to the third sample-hold sub-circuit sequentially, and obtains a plurality of the transition data of the input data signal from the first feedback equalization circuit or the second feedback equalization circuit, and the fifth latch or the sixth latch conducts digitalization of the transition data.

In an embodiment, the phase detecting device further includes a seventh latch electrically connected to the first XOR gate and outputting the first clock phase shift information and an eighth latch electrically connected to the second XOR gate and outputting the second clock phase shift information.

From the above, the phase detecting device and the clock data recovery circuit according to the present invention embed the decision feedback equalizer having at least two sample-hold sub-circuits into the phase detecting device of the clock data recovery circuit, incorporate the edge detector into the two feedback equalization circuits of the decision feedback equalizer, and employee XOR gate to execute operations of the sample data of the input data signal and transition data, so as to obtain the clock phase shift information (UP/DN) to adjust the phases of the positive, negative and edge clock signals.

Therefore, the present invention can be used for high speed, digital and analog clock data recovery circuits, and can form a half rate (or higher than quarter rate) feedback equalization circuit to reduce the bandwidth requirement of the first and second feedback equalization circuit, to conduct the equalization and calibration for the input data signal simultaneously, to reduce the complexity of the phase detecting device and the clock data recovery circuit, to reduce the calibration time of these clock signals, further to achieve more accurate clock data recovery with a lower power consumption, and to avoid the high-frequency noise disturbance generated from the separate or front and back arrangement of the prior clock data recovery circuit and the decision feedback equalizer.

DETAILED DESCRIPTION

The detail description of the disclosure is described by specific embodiments in the following. Those with ordinary skills in the arts can readily understand the other advantages and functions of the present invention after reading the disclosure of this specification, and also can implement or apply the present invention by other different embodiments.

Figure 1A:
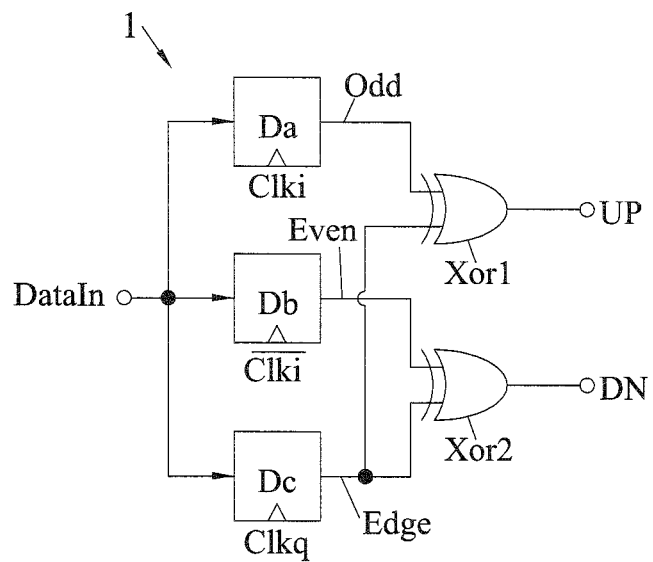
FIG. 1A depicts a circuit diagram of the Alexander phase detecting device according to the prior art.
Figure 1B:
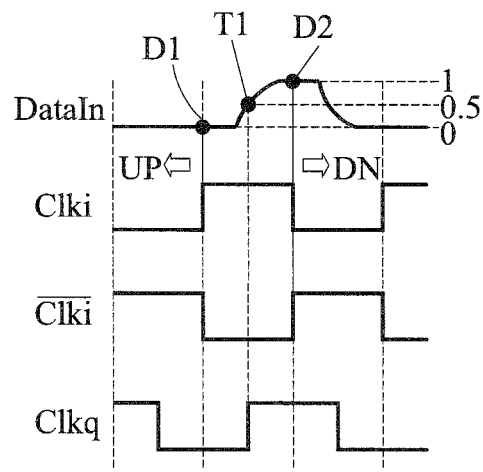
FIG. 1B depicts the timing chart of the phase detecting device in FIG. 1A according to the prior art.
Figure 2A:
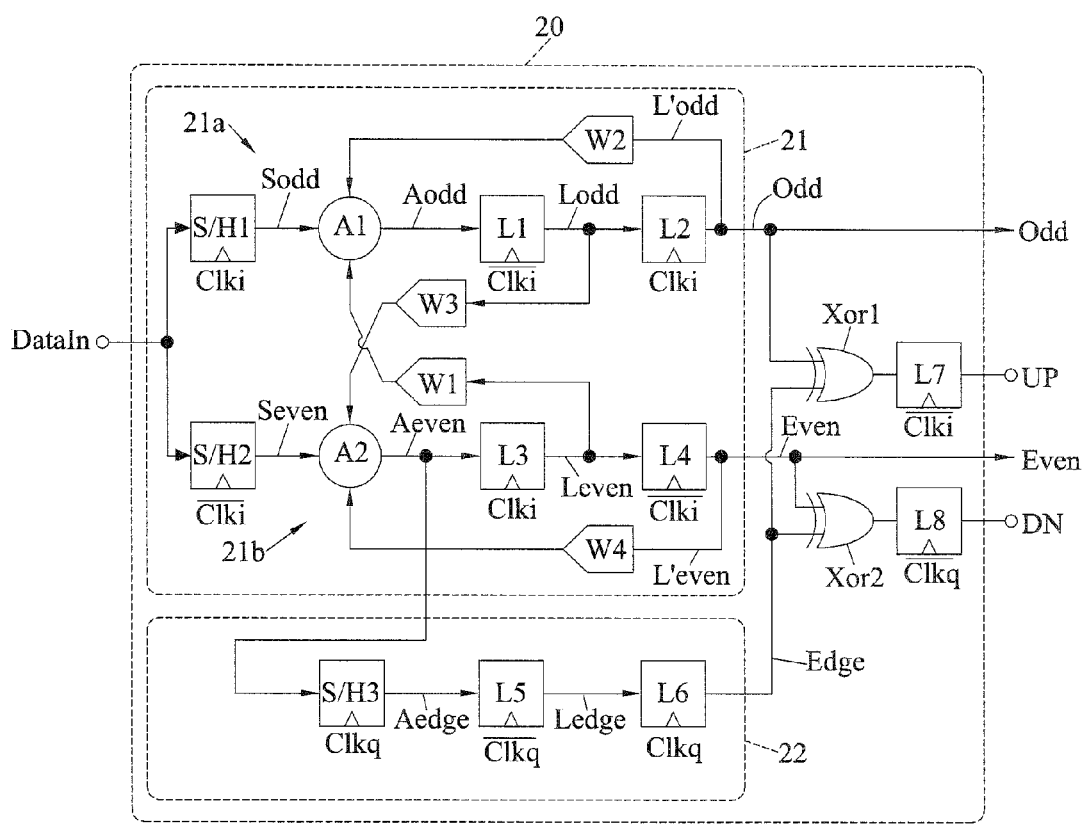
FIG. 2A depicts a circuit diagram of a phase detecting device embedded with a decision feedback equalizer according to the present invention.
Figure 2B:
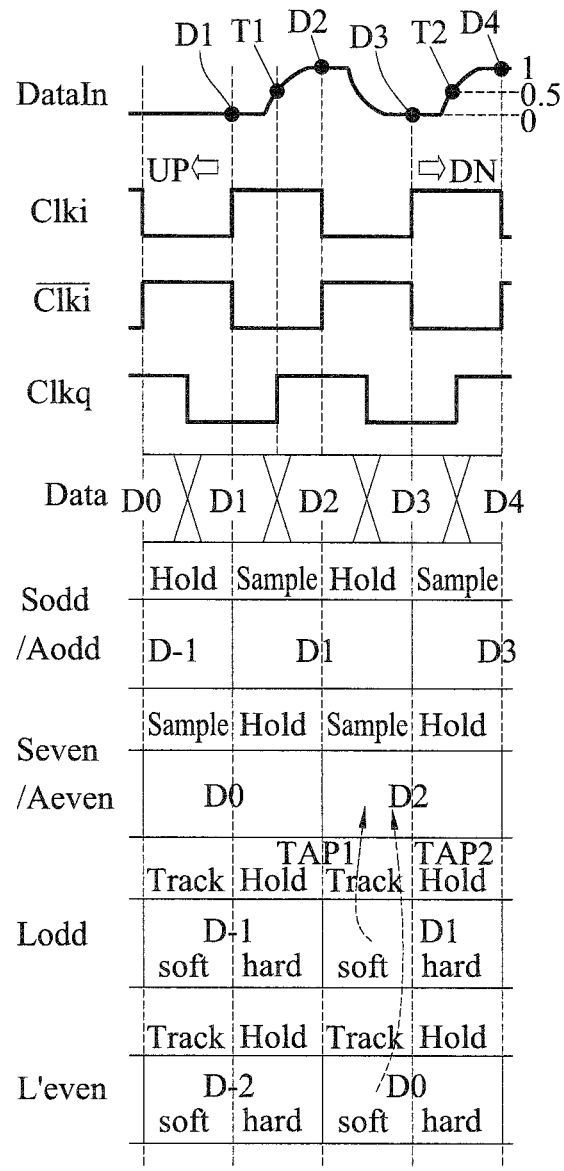
FIG. 2B depicts the timing chart of the phase detecting device embedded with the decision feedback equalizer in FIG. 2A according to the present invention.

FIG. 2A depicts a circuit diagram of a phase detecting device 20 embedded with a decision feedback equalizer 21 according to the present invention. FIG. 2B depicts the timing chart of the phase detecting device 20 embedded with the decision feedback equalizer 21 in FIG. 2A according the present invention.

The phase detecting device 20 comprises the decision feedback equalizer 21, an edge detector (ED) 22, a first XOR gate (Xor1), and a second XOR gate (Xor2).

In an embodiment, the decision feedback equalizer 21 includes two feedback equalization circuits, such as a first feedback equalization circuit 21a having a first sample-hold sub-circuit S/H1 and a second feedback equalization circuit 21b having a second sample-hold sub-circuit S/H2, so as to form a decision feedback equalizer with half rate.

In other embodiments, the decision feedback equalizer 21 includes more than two feedback equalization circuits and their sample-hold sub-circuits, for example, four or six feedback equalization circuits and their sample-hold sub-circuits, so as to form a decision feedback equalizer with quarter rate or one sixth rate, but the present invention is not limited thereto.

The first sample-hold sub-circuit S/H1 obtains the first sample data (Sodd) (i.e., Odd data) of an input data signal (DataIn) in light of the positive clock signal (Clki). The second sample-hold sub-circuit S/H2 obtains the second sample data (Seven) (i.e., Even data) of the input data signal (DataIn) in light of the negative clock signal ($\overline{\text{Clki}}$) corresponding to the positive clock signal (Clki). The phase difference of the negative clock signal ($\overline{\text{Clki}}$) and the positive clock signal (Clki) is 180°.

The first feedback equalization circuit 21a can include a first adder A1, a the first latch L1 and a second latch L2 electrically connected to the of the first sample-hold sub-circuit S/H1 sequentially, a first multiplier W1 electrically connected to the second feedback equalization circuit 21b, and a second multiplier W2 electrically connected to the first adder A1 and the second latch L2. The first adder A1 is electrically connected to the output terminal of the first sample-hold sub-circuit S/H1, the first latch L1 is electrically connected to the output terminal of the first adder A1, the second latch L2 is electrically connected to the output terminal of the first latch L1, the first multiplier W1 is electrically connected to the input terminal of the first adder A1 and the output terminal of the third latch L3, and the second multiplier W2 is electrically connected to the input terminal of the first adder A1 and the output terminal of the second latch L2.

The first sample-hold sub-circuit S/H1 obtains a plurality of the first sample data (Sodd) of the input data signal (DataIn), such as the first sample data D-1, D1, D2, and so on. The first adder A1, the first latch L1, the second latch L2, the first multiplier W1 and the second multiplier W2 conduct feedback equalization (e.g., the compensation of magnification ratio) for the first sample data (Sodd) to generate the first serial data (Odd) (i.e., the odd serial data) having the first sample data D-1, D1, D2, and so on.

The first adder A1 sums the first sample data (Sodd), the second sample data (Leven) fed back from the first multiplier W1, and the first sample data (L'odd) fed back from the second multiplier W2, to generate the first sample data (Aodd). Taking advantage of the feedback addition compensation of the two taps TAP1 and TAP2 of the first multiplier W1 and the second multiplier W2, respectively, to add the first sample data (Sodd) with its previous two sample data, the correctness of the first sample data (Aodd) can be improved.

In an embodiment, when the first adder A1 samples the first sample data D3, the first sample-hold sub-circuit S/H1 is in the sampling state (Sample) and the third latch L3 connected to the first multiplier W1 and the second latch L2 connected to the second multiplier W2 are in the tracking state (Track), during the first half period (the first bit time) of handling the first sample data D3. During the second half period (the second bit time) of handling the first sample data D3, the first sample-hold sub-circuit S/H1 is in the holding state (Hold), and the third latch L3 connected to the first multiplier W1 and the second latch L2 connected to the second multiplier W2 are in the holding state (Hold). The feedback information of the first multiplier W1 and the second multiplier W2 can be the soft decision (soft), but not the hard decision (hard).

The third latch L3 and the second latch L2, when being in the tracking state (Track), can let the first multiplier W1 and the second multiplier W2 begin to give the feedback of the second sample data (Leven) and the first sample data (L'odd) to the first adder A1, and the feedback process only requires at most half of time (one bit time). Therefore, the feedback information of the soft decision has the advantage of fast processing time.

The first adder A1 has two bit time to handle the first sample data (Sodd), such that the speed requirement of the first adder A1 can be reduced, and the first adder A1 can be guaranteed to generate the correct first sample data (Aodd).

The first latch L1 depends on the negative clock signal ($\overline{\text{Clki}}$) to be in the tracking state (Track) or the holding state (Hold), and to transform the first sample data (Aodd) to the first sample data (Lodd). The second latch L2 depends on the positive clock signal (Clki) to be in the tracking state (Track) or the holding state (Hold), and to transform the first sample data (Lodd) to the first sample data (L'odd). Both the first latch L1 and the second latch L2 can be equivalent to a D-type flip-flop, and transform the first sample data (Aodd) to the first serial data (Odd) having digital data 0 and 1.

The second feedback equalization circuit 21b can include a second adder A2, a third latch L3 and a fourth latch L4 electrically connected to the of the second sample-hold sub-circuit S/H2 sequentially, a third multiplier W3 electrically connected to the first feedback equalization circuit 21a, and a fourth multiplier W4 electrically connected to the second adder A2 and the fourth latch L4. The second adder A2 is electrically connects to the output terminal of the second sample-hold sub-circuit S/H2, the third latch L3 is electrically connected to the output terminal of the second adder A2, the fourth latch L4 electrically connects to the output terminal of the third latch L3, the third multiplier W3 is electrically connected to the input terminal of the second adder A2 and the output terminal of the first latch L1, and the fourth multiplier W4 is electrically connected to the input terminal of the first adder A1 and the output terminal of the fourth latch L4.

The second sample-hold sub-circuit S/H2 obtains a plurality of the second sample data (Seven) of the input data signal (DataIn), such as the second sample data D0, D2, D4, and so on. The second adder A2, the third latch L3, the fourth latch L4, the third multiplier W3 and the fourth multiplier W4 conduct feedback equalization (e.g., the compensation of magnification ratio) to the second sample data (Seven) to generate the second serial data (Even) (i.e., the even serial data) having the second sample data D0, D2, D4, and so on.

The second adder A2 sums the second sample data (Seven), the second sample data (Lodd) fed back from the third multiplier W3, and the second sample data (L'even) fed back from the fourth multiplier W4, to generate the second sample data (Aeven). Taking advantage of the feedback addition compensation of the two taps TAP1 and TAP2 of the third multiplier W3 and the fourth multiplier W4, respectively, to add the second sample data (Seven) with its previous two sample data, the correctness of the second sample data (Aeven) can be improved.

In an embodiment, when the second adder A2 samples the second sample data D4, the second sample-hold sub-circuit S/H2 is in the sampling state (Sample), and the first latch L1 connected to the third multiplier W3 and the fourth latch L4 connected to the fourth multiplier W4 are in the tracking state (Track), during the first half period (the first bit time) of handling the second sample data D4. During the second half period (the second bit time) of handling the second sample data D4, the second sample-hold sub-circuit S/H2 is in the holding state (Hold), and the first latch L1 connected to the third multiplier W3 and the fourth latch L4 connected to the fourth multiplier W4 are in the holding state (Hold). The feedback information of the third multiplier W3 and the fourth multiplier W4 can be the soft decision (soft), but not the hard decision (hard).

The first latch L1 and the fourth latch L4, when being in the tracking state (Track), can let the third multiplier W3 and the fourth multiplier W4 begin to give the feedback of the first sample data (Lodd) and the second sample data (L'even) to the second adder A2, and the feedback process only requires at most half of time (one bit time). Therefore, the feedback information of the soft decision has the advantage of fast processing time.

In an embodiment, the second adder A2 has two bit time to handle the second sample data (Seven), such that the speed requirement of the second adder A2 can be reduced and the second adder A2 can be guaranteed to generate the correct second sample data (Aeven).

The third latch L3 depends on the positive clock signal (Clki) to be in the tracking state (Track) or the holding state (Hold), and to transform the second sample data (Aeven) to the second sample data (Leven). The fourth latch L4 depends on the negative clock signal ($\overline{Clki}$) to be in the tracking state (Track) or the holding state (Hold), and to transform the second sample data (Leven) to the second sample data (L'even). Both the third latch L3 and the fourth latch L4 can be equivalent to a D-type flip-flop, and transform the second sample data (Aeven) to the second serial data (Even) having digital data 0 and 1.

The edge detector 22 can have the fifth latch L5 and the sixth latch L6 which are electrically connected to the third sample-hold sub-circuit S/H3 sequentially. The third sample-hold sub-circuit S/H3 obtains a plurality of the transition data (Aedge) of the input data signal (DataIn) from the first feedback equalization circuit 21a or the second feedback equalization circuit 21b, for example, the transition data T1, T2, etc. in FIG. 2B.

The fifth latch L5 depends on the negative edge clock signal ($\overline{Clkq}$) corresponding to the edge clock signal (Clkq) to be in the tracking state (Track) or the holding state (Hold), and to transform the transition data (Aedge) to the transition data (Ledge). The sixth latch L6 depends on the edge clock signal (Clkq) to be in the tracking state (Track) or the holding state (Hold), and to transform the transition data (Ledge) to the transition data (Edge). Both the fifth latch L5 and the sixth latch L6 can be equivalent to a D-type flip-flop, and transform the transition data (Ledge) to the transition data (Edge) having digital data 0 and 1.

The first XOR gate (Xor1) is electrically connected to the output terminal of the second latch L2 of the first feedback equalization circuit 21a and the output terminal of the sixth latch L6 of the edge detector 22, and executes an XOR operation for the first sample data (L'odd) of the first serial data (Odd) and the transition data (Edge) to generate the first clock phase shift information (UP), so as to determine whether to make these clock signals (Clki), ($\overline{Clki}$), (Clkq), and ($\overline{Clkq}$) lead forward (move to the left).

The second XOR gate (Xor2) is electrically connected to the output terminal of the fourth latch L4 of the second feedback equalization circuit 21b and the output terminal of the sixth latch L6 of the edge detector 22, and executes an XOR operation for the second sample data (L'even) of the second serial data (Even) and the transition data (Edge) to generate the second clock phase shift information (DN), so as to determine whether to make these clock signals (Clki), ($\overline{Clki}$), (Clkq), and ($\overline{Clkq}$) delay backward (move to the right).

For example, in the input data signal (DataIn), the first sample data D1 of the first sample data (L'odd) equals to 0 (please refer to FIG. 2B). The transition data T1 of the transition data (Edge) is larger than 0.5, and becomes to 1 after digitalization. Therefore, after the first XOR gate (Xor1) executing the XOR operation for the first sample data D1 and the transition data T1, the first clock phase shift information (UP) equal to 1 is obtained. After the second XOR gate (Xor2) executing the XOR operation for the second sample data D2 and the transition data T1, the second clock phase shift information (DN) equal to 0 is obtained. It is thus represented that the first sample data D1 of the first serial data (Odd) is different to the transition data T1 of the transition data (Edge), and the second sample data D2 of the second serial data (Even) is identical with the transition data T1 of the transition data (Edge), such that these clock signals (Clki), ($\overline{Clki}$), (Clkq), and ($\overline{Clkq}$) can be leaded forward to a predetermined phase to be calibrated.

For another example, the first sample data D3 of the first sample data (L'odd) equals to 0. The transition data T2 of the transition data (Edge) is less than 0.5, and becomes to 0 after digitalization. The second sample data D4 of the second sample data (L'even) equals to 1. Thus, the first XOR gate (Xor1), after executing the XOR operation for the first sample data D3 and the transition data T2, will obtain the first clock phase shift information (UP) equal to 0, and the second XOR gate (Xor2), after executing the XOR operation for the first sample data D3 and the transition data T2, will obtain the second clock phase shift information (DN) equal to 1. It is thus represented that the first sample data D3 of the first serial data (Odd) is identical with the transition data T2 of the transition data (Edge), and the second sample data D4 of the second serial data (Even) is identical with the transition data T2 of the transition data (Edge), such that these clock signals (Clki), ($\overline{Clki}$), (Clkq), and ($\overline{Clkq}$) can be delayed backward to a predetermined phase to be calibrated.

The phase detecting device 20 can include the seventh latch L7 and the eighth latch L8. The seventh latch L7 is electrically connected to the first XOR gate (Xor1), and able to correctly output the first clock phase shift information (UP). The eighth latch L8 is electrically connected to the second XOR gate (Xor2), and able to correctly output the second clock phase shift information (DN).

Figure 3A:
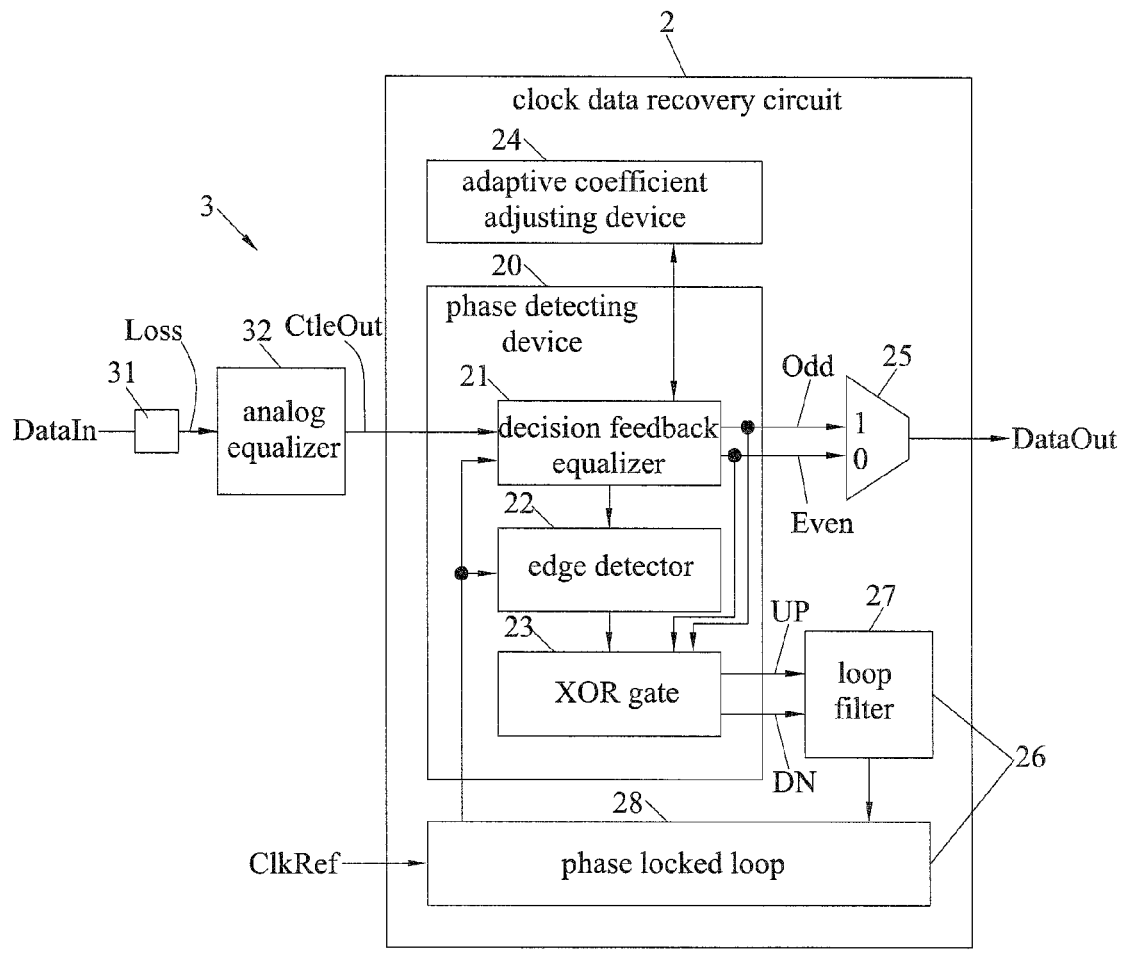
FIG. 3A depicts a circuit diagram of a clock data recovery circuit embedded with a decision feedback equalizer and the receiver according to the present invention.
Figure 3B:
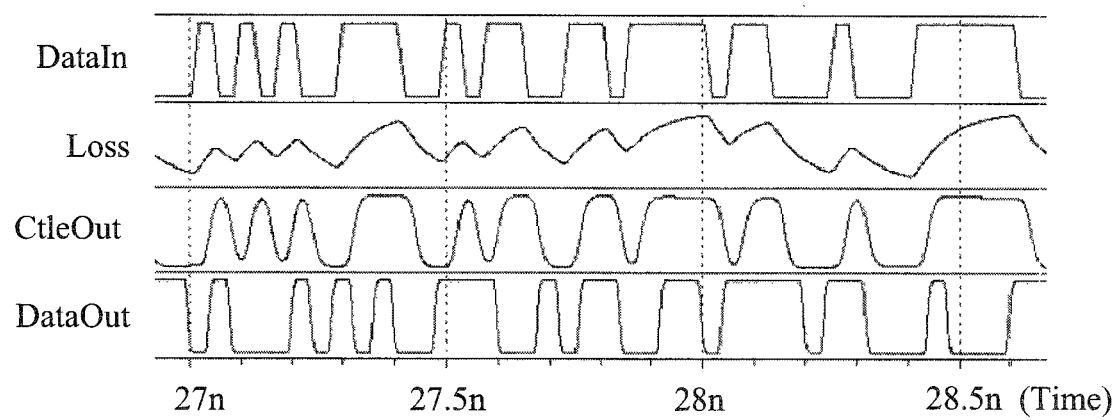
FIG. 3B depicts the simulation chart of the demodulated signal of the decision feedback equalizer in FIG. 3A according to the present invention.

FIG. 3A depicts the circuit diagram of the clock data recovery circuit 2 embedded with the decision feedback equalizer 21 and the receiver 3 according to the present invention. FIG. 3B depicts the simulation chart of the demodulated signal of the decision feedback equalizer 21 in FIG. 3A.

As shown in FIG. 3A and FIGS. 2A and 2B, the clock data recovery circuit 2 includes the phase detecting device 20 and the clock adjustment circuit 26, and can further include the adaptive coefficient adjusting device 24 and the selector 25, but the present invention is not limited thereto.

The decision feedback equalizer 21 includes the first feedback equalization circuit 21a having the first sample-hold sub-circuit S/H1 and the second feedback equalization circuit 21b having the second sample-hold sub-circuit S/H2. The first sample-hold sub-circuit S/H1 obtains the first sample data (Sodd) of the input data signal (DataIn) in light of the positive clock signal (Clki). The second sample-hold sub-circuit S/H2 obtains the second sample data (Seven) of the input data signal (DataIn) in light of the negative clock signal ($\overline{Clki}$) corresponding to the positive clock signal (Clki).

The edge detector 22 has the third sample-hold sub-circuit S/H3. The edge detector 22 is electrically connected to the first feedback equalization circuit 21a or the second feedback equalization circuit 21b. The third sample-hold sub-circuit S/H3 obtains the transition data (Aedge) of the input data signal (DataIn) in light of the edge clock signal (Clkq) corresponding to the positive clock signal (Clki).

The first XOR gate (Xor1) is electrically connected to the first feedback equalization circuit 21a and the edge detector 22. The first XOR gate (Xor1) executes an XOR operation for the first sample data (L'odd) of the first serial data (Odd) and the transition data (Edge) to generate the first clock phase shift information (UP). The second XOR gate (Xor2) is electrically connected to the second feedback equalization circuit 21b and the edge detector 22. The second XOR gate (Xor2)

executes an XOR operation for the second sample data (L'even) of the second serial data (Even) and the transition data (Edge) to generate the second clock phase shift information (DN).

Please also refer to the above detailed description of FIGS. 2A and 2B for the relevant technical information of the phase detecting device 20, further description hereby omitted.

The clock adjustment circuit 26 is electrically connected to the phase detecting device 21 of the phase detecting device 20, and the first XOR gate (Xor1) and the second XOR gate (Xor2) of the XOR gate 23, to adjust the phases of the positive clock signal (Clki), the negative clock signal ($\overline{Clki}$), the edge clock signal (Clkq) and the negative edge clock signal ($\overline{Clkq}$) based on the first clock phase shift information (UP) and the second clock phase shift information (DN), so as to simultaneously lead forward or delay backward these clock signals (Clki), ($\overline{Clki}$), (Clkq), and ($\overline{Clkq}$) a predetermined phase to calibrate them.

The clock data recovery circuit 2 can include the adaptive coefficient adjusting device 24 electrically connected to the decision feedback equalizer 21. The adaptive coefficient adjusting device 24 is used to adjust the magnification ratio of the first multiplier W1, the second multiplier W2, the third multiplier W3 and the fourth multiplier W4, so as to feedback equalize the first sample data (Aodd), the second sample data (Aeven) and the transition data (Aedge). In an embodiment, the adaptive coefficient adjusting device 24 can have components such as the threshold tracking circuit or the error equalizer, but not limited thereto.

The clock data recovery circuit 2 can include the selector 25 electrically connected to the decision feedback equalizer 21. The selector 25 is used to select and sort the first serial data (Odd) and the second serial data (Even) of the input data signal (DataIn) to generate the output data signal (DataOut).

The clock adjustment circuit 26 can have the loop filter 27 that is electrically connected to the first XOR gate (Xor1) or the second XOR gate (Xor2) of the XOR gate 23. The loop filter 27 receives the first clock phase shift information (UP) and the second clock phase shift information (DN).

The clock adjustment circuit 26 can have the phase locked loop (PLL) 28 that is used to be electrically connected to the decision feedback equalizer 21 and the edge detector 22. The phase locked loop 28 receives the reference clock signal (ClkRef) to adjust the phases of the positive clock signal (Clki), the negative clock signal ($\overline{Clki}$), the edge clock signal (Clkq) and the negative edge clock signal ($\overline{Clkq}$) based on the first clock phase shift information (UP) and the second clock phase shift information (DN), that can simultaneously lead forward or delay backward these clock signals (Clki), ($\overline{Clki}$), (Clkq), and ($\overline{Clkq}$) a predetermined phase to calibrate them. The first sample-hold sub-circuit S/H1, the second sample-hold sub-circuit S/H2 and the third sample-hold sub-circuit S/H3 can thus obtain the correct sample data based on the calibrated clock signals (Clki), ($\overline{Clki}$), and (Clkq), respectively.

The phase locked loop 28 can have components, such as the phase frequency detector (RFD), the voltage controlled oscillator (VCO), the frequency divider or phase interpolator (PI), and the voltage controlled oscillator can be used to adjust the phases of the clock signals (Clki), ($\overline{Clki}$), (Clkq), and ($\overline{Clkq}$). However, the present invention is not limited thereto.

Further, as shown in FIGS. 3A and 3B, the receiver 3 includes the clock data recovery circuit 2 of the present invention, the channel 31 and the analog equalizer 32. The channel 31 can be the circuit of a print circuit board. The analog equalizer 32 can be the continued time linear equalizer (CTLE).

After passing through the channel 31, the input data signal (DataIn) will have noise or will form the attenuation data signal (Loss). The analog equalizer 32 can equalize the attenuation data signal (Loss) in advance to form the output data signal (CtleOut). The decision feedback equalizer 21 then equalizes the output data signal (CtleOut) to generate the output data signal (DataOut), so as to restore the clock data of the output data signal (DataOut) to identical with or match the clock data of the input data signal (DataIn). In other embodiments, the receiver 3 can have no analog equalizer 32, so that the decision feedback equalizer 21 directly equalizes the input data signal (DataIn) or its attenuation data signal (Loss) to generate the output data signal (DataOut).

Figure 4A:
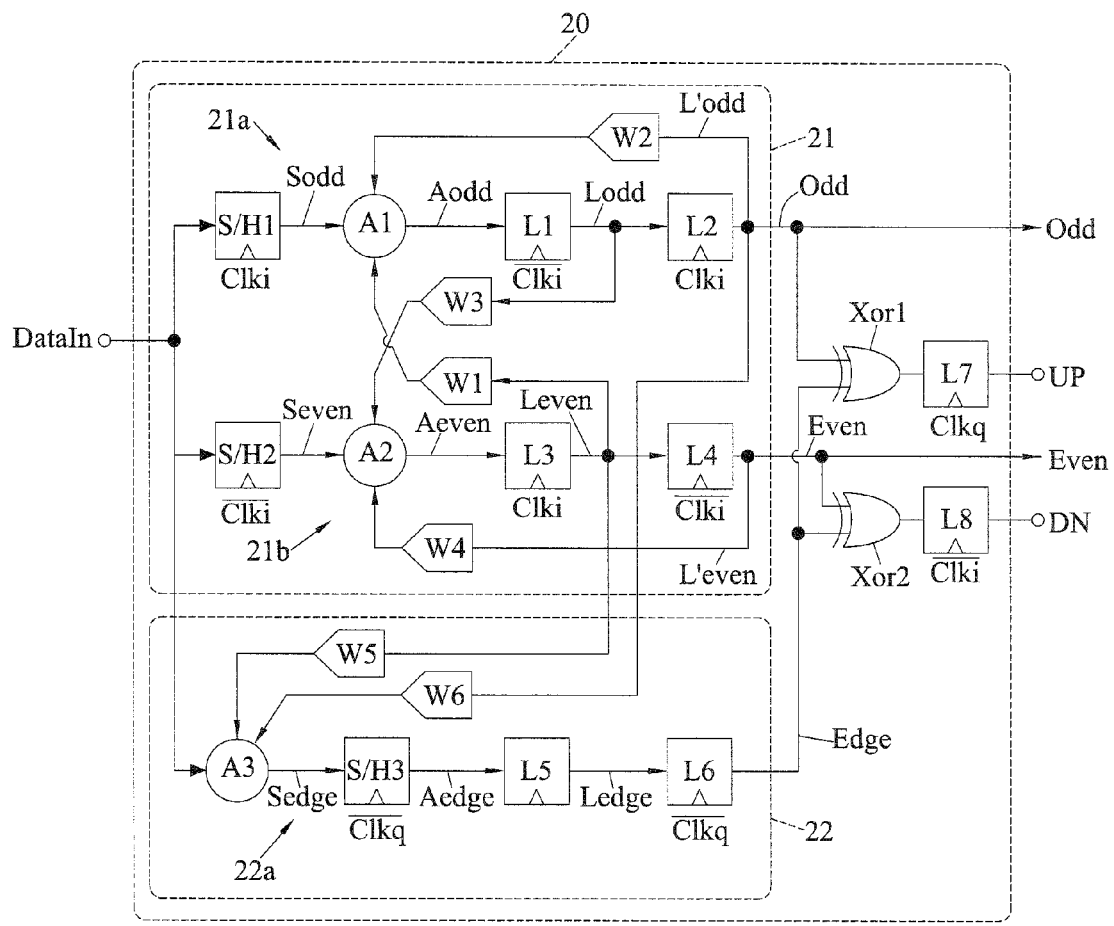
FIG. 4A depicts another circuit diagram of a phase detecting device embedded with a decision feedback equalizer according to the present invention.
Figure 4B:
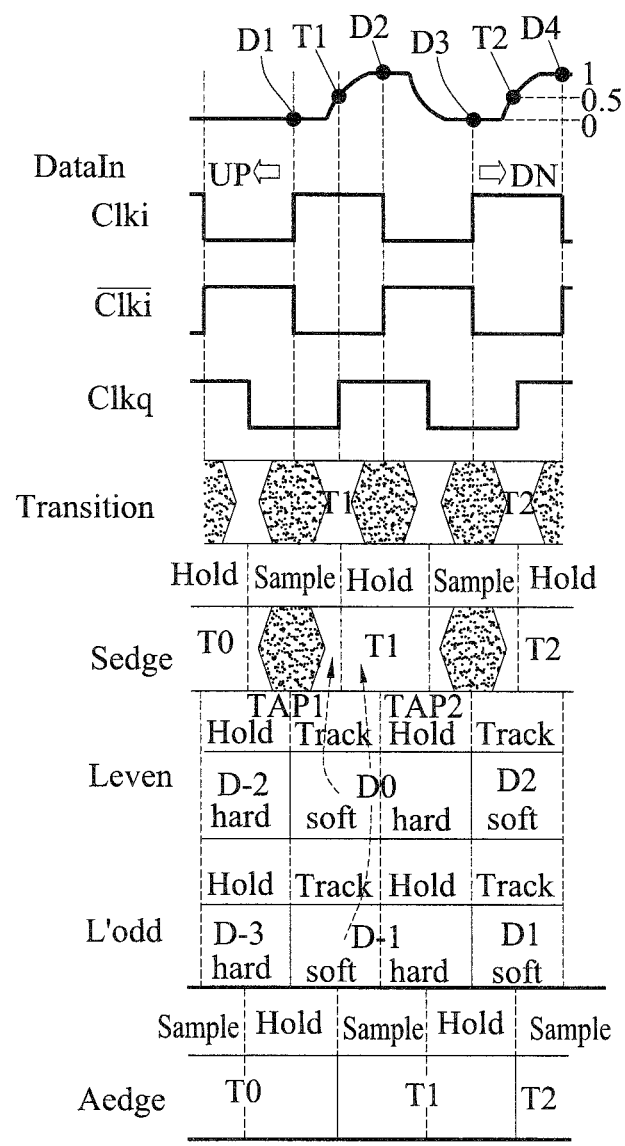
FIG. 4B depicts the timing chart of the phase detecting device embedded with the decision feedback equalizer in FIG. 4A according to the present invention.

FIG. 4A depicts another circuit diagram of a phase detecting device 20 embedded with a decision feedback equalizer 21 according to the present invention. FIG. 4B depicts the timing chart of the phase detecting device 20 embedded with the decision feedback equalizer 21 in FIG. 4A according to the present invention.

The decision feedback equalizer 21 comprises two feedback equalization circuit, including, for example, a first feedback equalization circuit 21a having a first sample-hold sub-circuit S/H1 and a second feedback equalization circuit 21b having a second sample-hold sub-circuit S/H2, to constitute a half rate decision feedback equalizer 21. The edge detector 22 comprises a third feedback equalization circuit 22a, to achieve the equalization effect of the edge detector 22.

FIGS. 4A and 4B differ from FIGS. 2A and 2B in that: the edge detector 22 of FIGS. 4A and 4B comprises a third feedback equalization circuit 22a having a third sample-hold sub-circuit S/H3 and electrically connected to the first feedback equalization circuit 21a and the second feedback equalization circuit 21b. The third feedback equalization circuit 22a can also comprises a third adder A3 electrically connecting the first sample-hold sub-circuit S/H1 to the third sample-hold sub-circuit S/H3, a fifth multiplier W5 electrically connected to the second feedback equalization circuit 21b and the third adder A3, a sixth multiplier W6 electrically connected to the first feedback equalization circuit 21a and the third adder A3, and a fifth latch L5 and sixth latch L6 that are electrically connected to the third sample-hold sub-circuit S/H3.

The fifth multiplier W5 electrically connects an output terminal of the third latch L3 of the second feedback equalization circuit 21b to an input terminal of the third adder A3. The sixth multiplier W6 electrically connects an output terminal of the second latch L2 of the first feedback equalization circuit 21a to an input terminal of the third adder A3. The third sample-hold sub-circuit S/H3 is electrically connected to the output terminal of the third adder A3. The fifth latch L5 is electrically connected to the output terminal of the third sample-hold sub-circuit S/H3. The sixth latch L6 is electrically connected to the output terminal of the fifth latch L5.

The third adder A3 acquires an input data signal (DataIn), and acquires second sample data (Leven) of the third latch L3 and first sample data (L'odd) of the second latch L2 through the fifth multiplier W5 and the sixth multiplier W6, respectively. The third adder A3 adds the input data signal (DataIn), the second sample data (Leven) and the first sample data (L'odd), and generates transition data (Sedge) to the third sample-hold sub-circuit S/H3. The third sample-hold sub-circuit S/H3 transforms the transition data (Sedge) to the transition data (Aedge) according to the edge clock signal ($\overline{Clkq}$). The fifth latch L5 transforms the transition data (Aedge) to the transition data (Ledge), and outputs the transition data (Ledge) to the sixth latch L6.

The third adder A3 acquires the transition data of the input data signal (DataIn), such as T1, T2 etc. The third sample-hold sub-circuit S/H3, the fifth latch L5、sixth latch L6, the fifth multiplier W5 and the sixth multiplier W6 conducts feedback equalization process (e.g., the compensation of magnification ratio) for the transition data, to generate third serial data (e.g., edge serial data) having the transition data T1 and T2, i.e., the transition data (Edge).

The third adder A3 adds the input data signal (DataIn), the second sample data (Leven) feedback by the fifth multiplier W5, and the first sample data (L'odd) feedback by the sixth multiplier W6, to generate the third sample data, i.e., transition data (Sedge). Taking advantage of the feedback addition compensation of the two taps TAP1 and TAP2 of the fifth multiplier W5 and the sixth multiplier W6, respectively, to add the input data signal (DataIn) with its previous two sample data, the correctness of the third sample data (Sedge) can be improved.

In order to sample the input data signal (DataIn) generated by the compensation data feedback by the fifth multiplier W5 and the sixth multiplier W6, the third sample-hold sub-circuit S/H3 stays in the tracking state (Track) or in the holding state according to the negative edge clock signal ($\overline{Clkq}$) corresponding to the edge clock signal (Clkq), and transforms the transition data (Sedge) to the transition data (Aedge). The fifth latch L5 stays in the tracking state (Track) of in the holding state (Hold), and transforms the transition data (Aedge) to the transition data (Ledge). The sixth latch L6 stays in the tracking state (Track) or in the holding state (Hold) according to the negative edge clock signal ($\overline{Clkq}$) corresponding to the edge clock signal (Clkq), and transforms the transition data (Ledge) to the transition data (Edge). Both the fifth latch L5 and the fourth latch L4 can be equivalent or changed to a D-type flip-flop, and transform the transition data (Ledge) to the transition data (Edge) having digital data 0 and 1.

Summary from the above, the phase detecting device and the clock data recovery circuit according to the present invention embed the decision feedback equalizer having at least two sample-hold sub-circuits into the phase detecting device of the clock data recovery circuit, incorporate the edge detector to the two decision feedback equalization circuits, and use XOR gates to execute an XOR operation for the sample data of the input data signal and the transition data, so as to obtain the clock phase shift information (UP/DN) to adjust the phases of the positive, negative and edge clock signals.

Therefore, the present invention can be used in the high speed, digital or analog clock data recovery circuit and can form a half rate (or higher than quarter rate) feedback equalization circuit to reduce the bandwidth requirement of the first and second feedback equalization circuit. The present invention also can conduct the equalization and calibration for the input data signal simultaneously, reduce the complexity of the phase detecting device and the clock data recovery circuit, reduce the calibration time of these clock signals, achieve more accurate clock data recovery with a lower power consumption, and avoid the high-frequency noise disturbance generated from the separate or front and back arrangement of the prior clock data recovery circuit and the decision feedback equalizer.

The above embodiments are merely used to describe the principle, characteristic, and effect of the present invention, but not to limit the present invention. Anyone with ordinary skills in the arts can modify or change the above embodiments without departing from the spirit and scope of the disclosure. Any use of the present invention complete disclosure and equivalent changes and modifications, all of the following claims should be covered. Accordingly, the scope of the present invention should follow the appended claims.

What is claimed is:

1. A phase detecting device, comprising:
a decision feedback equalizer including a first feedback equalization circuit having a first sample-hold sub-circuit and a second feedback equalization circuit having a second sample-hold sub-circuit, wherein the first sample-hold sub-circuit obtains first sample data of an input data signal in light of a positive clock signal, and the second sample-hold sub-circuit obtains second sample data of the input data signal in light of a negative clock signal corresponding to the positive clock signal;
an edge detector electrically connected to the first feedback equalization circuit or the second feedback equalization circuit and having a third sample-hold sub-circuit that obtains transition data of the input data signal in light of an edge clock signal corresponding to the positive clock signal;
a first XOR gate electrically connected to the first feedback equalization circuit and the edge detector and executing an XOR operation for the first sample data and the transition data to generate first clock phase shift information; and
a second XOR gate electrically connected to the second feedback equalization circuit and the edge detector and executing the XOR operation for the second sample data and the transition data to generate second clock phase shift information.

2. The phase detecting device according to claim 1, wherein the first feedback equalization circuit further includes a first adder, a first latch and a second latch electrically connected to the first sample-hold sub-circuit sequentially, a first multiplier electrically connected to the second feedback equalization circuit, and a second multiplier electrically connected to the first adder and the second latch, and obtains a plurality of the first sample data of the input data signal, and the first adder, the first latch, the second latch, the first multiplier and the second multiplier conduct feedback equalization to the first sample data to generate first serial data.

3. The phase detecting device according to claim 1, wherein the second feedback equalization circuit further includes a second adder, a third latch and a fourth latch electrically connected to the second sample-hold sub-circuit sequentially, a third multiplier electrically connected to the first feedback equalization circuit, and a fourth multiplier electrically connected to the second adder and the fourth latch, and obtains a plurality of the second sample data of the input data signal, and the second adder, the third latch, the fourth latch, the third multiplier and the fourth multiplier conduct feedback equalization to the second sample data to generate second serial data.

4. The phase detecting device according to claim 1, wherein the edge detector further includes a fifth latch and a sixth latch electrically connected to the third sample-hold sub-circuit sequentially, and obtains a plurality of the transition data of the input data signal from the first feedback equalization circuit or the second feedback equalization circuit, and the fifth latch or the sixth latch conducts digitalization of the transition data.

5. The phase detecting device according to claim 1, further comprising a seventh latch electrically connected to the first XOR gate and outputting the first clock phase shift information and an eighth latch electrically connected to the second XOR gate and outputting the second clock phase shift information.

6. The phase detecting device according to claim 1, wherein the edge detector comprises a third feedback equalization circuit having the third sample-hold sub-circuit, and the third feedback equalization circuit is electrically connected to the first feedback equalization circuit and the second feedback equalization circuit.

7. The phase detecting device according to claim 6, wherein the third feedback equalization circuit further comprises a third adder that electrically connects the first sample-hold sub-circuit to the third sample-hold sub-circuit, a fifth multiplier electrically connected to the second feedback equalization circuit and the third adder, a sixth multiplier electrically connected to the first feedback equalization circuit and the third adder, and a fifth latch and a sixth latch electrically connected to the third sample-hold sub-circuit sequentially.

8. A clock data recovery circuit, comprising:
a phase detecting device including:
a decision feedback equalizer including a first feedback equalization circuit having a first sample-hold sub-circuit and a second feedback equalization circuit having a second sample-hold sub-circuit, wherein the first sample-hold sub-circuit obtains first sample data of an input data signal in light of a positive clock signal, and the second sample-hold sub-circuit obtains second sample data of the input data signal in light of a negative clock signal corresponding to the positive clock signal;
an edge detector electrically connected to the first feedback equalization circuit and the second feedback equalization circuit and having a third sample-hold sub-circuit that obtains transition data of the input data signal in light of an edge clock signal corresponding to the positive clock signal;
a first XOR gate electrically connected to the first feedback equalization circuit and the edge detector and executing an XOR operation for the first sample data and the transition data to generate first clock phase shift information; and
a second XOR gate electrically connected to the second feedback equalization circuit and the edge detector and executing the XOR operation for the second sample data and the transition data to generate second clock phase shift information; and
a clock adjustment circuit electrically connected to the phase detecting device and adjusting phases of the positive clock signal, the negative clock signal and the edge clock signal based on the first clock phase shift information and the second clock phase shift information.

9. The clock data recovery circuit according to claim 8, wherein the first feedback equalization circuit further includes a first adder, a first latch and a second latch electrically connected to the first sample-hold sub-circuit sequentially, a first multiplier electrically connected to the second feedback equalization circuit, and a second multiplier electrically connected to the first adder and the second latch, and obtains a plurality of the first sample data of the input data signal, and the first adder, the first latch, the second latch, the first multiplier and the second multiplier conduct feedback equalization to the first sample data to generate first serial data.

10. The clock data recovery circuit according to claim 8, wherein the second feedback equalization circuit further includes a second adder, a third latch and a fourth latch electrically connected to the second sample-hold sub-circuit sequentially, a third multiplier electrically connected to the first feedback equalization circuit, and a fourth multiplier electrically connected to the second adder and the fourth latch, and obtains a plurality of the second sample data of the input data signal, and the second adder, the third latch, the fourth latch, the third multiplier and the fourth multiplier conduct feedback equalization to the second sample data to generate second serial data.

11. The clock data recovery circuit according to claim 8, wherein the edge detector further includes a fifth latch and a sixth latch electrically connected to the third sample-hold sub-circuit sequentially, and obtains a plurality of the transition data of the input data signal from the first feedback equalization circuit or the second feedback equalization circuit, and the fifth latch or the sixth latch conducts digitalization of the transition data.

12. The clock data recovery circuit according to claim 8, further comprising a seventh latch electrically connected to the first XOR gate and outputting the first clock phase shift information and an eighth latch electrically connected to the second XOR gate and outputting the second clock phase shift information.

* * * * *